United States Patent
Hiroshima

(10) Patent No.: US 8,410,537 B2
(45) Date of Patent: Apr. 2, 2013

(54) NONVOLATILE SEMICONDUCTOR MEMORY DEVICE AND METHOD OF MANUFACTURING THE SAME

(75) Inventor: Takashi Hiroshima, Ota (JP)

(73) Assignees: SANYO Semiconductor Co., Ltd., Ora-gun (JP); Semiconductor Components Industries, LLC, Phoenix, AZ (US)

( * ) Notice: Subject to any disclaimer, the term of this patent is extended or adjusted under 35 U.S.C. 154(b) by 177 days.

(21) Appl. No.: 12/974,864

(22) Filed: Dec. 21, 2010

(65) Prior Publication Data

US 2011/0156124 A1 Jun. 30, 2011

(30) Foreign Application Priority Data

Dec. 25, 2009 (JP) ................................. 2009-294979

(51) Int. Cl.
*H01L 29/76* (2006.01)

(52) U.S. Cl. .. 257/314; 257/315; 257/316; 257/E29.129

(58) Field of Classification Search ................... 257/314, 257/315, 316, E29.129
See application file for complete search history.

(56) References Cited

FOREIGN PATENT DOCUMENTS

| JP | 2000-173278 A | 6/2000 |
|---|---|---|
| JP | 2008-140431 | 6/2008 |

*Primary Examiner* — Tan N Tran
(74) *Attorney, Agent, or Firm* — Morrison & Foerster LLP

(57) ABSTRACT

The invention enhances program performance by increasing a coupling ratio between an N+ type source layer and a floating gate and reduces a memory cell area. Trenches are formed on the both sides of an N+ type source layer. The sidewalls of the trench includes first and second trench sidewalls that are parallel to end surfaces of two element isolation layers, a third trench sidewall that is perpendicular to the STIs, and a fourth trench sidewall that is not parallel to the third trench sidewall. The N+ type source layer is formed so as to extend from the bottom surface of the trench to the fourth trench sidewall, largely overlapping a floating gate, by performing ion-implantation of arsenic ion or the like in a parallel direction to the third trench sidewall and in a perpendicular direction or at an angle to a P type well layer from above the trench having this structure.

9 Claims, 9 Drawing Sheets

NONVOLATILE SEMICONDUCTOR MEMORY DEVICE AND METHOD OF MANUFACTURING THE SAME

CROSS-REFERENCE OF THE INVENTION

This application claims priority from Japanese Patent Application No.JP2009-294947, the content of which is incorporated herein by reference in its entirety.

BACKGROUND OF THE INVENTION

Field of the Invention

The invention relates to a split gate type nonvolatile semiconductor memory device, in particular, to a nonvolatile semiconductor memory device that realizes a high coupling ratio between a source layer and a floating gate and a method of manufacturing the same.

There is an increasing demand for a nonvolatile semiconductor memory device as a market of portable electronic products is expanding rapidly. A digital camera, an electronic organizer, an electronic responder, a programmable IC and the like record data in a nonvolatile semiconductor memory device. There are various types of nonvolatile semiconductor memory devices for this purpose, and a split gate type nonvolatile semiconductor memory device is also one of these.

The structure of a memory cell 100 of a conventional split gate type nonvolatile semiconductor memory device will be described referring to FIG. 12. An N+ type source layer 102 and an N+ type drain layer 103 are formed in the front surface of a P type well layer 101 that is isolated by element isolation layers 108 (not shown, shown in FIG. 11A). A gate insulation film 104 is formed from on the N+ type source layer 102 onto the N+ type drain layer 103, a FG (floating gate) 105 is formed on the gate insulation film 104, and a CG (control gate) 107 is formed on the FG 105 with a tunnel insulation film 106 being interposed therebetween. FIG. 11A is a plan view of the memory cell, and 103a indicates a drain contact.

The data writing, erasing and reading operations of the memory cell having this structure will be briefly described. First, the data writing operation will be described. A potential higher than the potential of the N+ type drain layer 103 is applied to the N+ type source layer 102, and a potential higher than the potential of the N+ type drain layer 103 is applied to the CG 107. By this, the front surface of the P type well layer 101 immediately under the gate insulation film 104 is type-inverted to form an N type channel layer, and an electron current flows from the N+ type drain layer 103 to the N+ type source layer 102.

In this case, the electrons of the electron current are accelerated by a high electric field at the PN junction formed between the N+ type source layer 102 and the P type well layer 101, and become high energy hot electrons. Some of the hot electrons are absorbed in the FG 105 that has a high potential by capacitive coupling with the N+ type source layer 102, thereby completing the data writing.

The data erasing operation will be described next. When a high voltage is applied to the CG 107 in the state where the N+ type source layer 102 and the N+ type drain layer 103 are at 0V, electrons absorbed in the FG 105 are taken out from the FG 105 and absorbed in the CG 107 through a thin portion of the tunnel insulation film 106 (a portion between a protruding portion of the FG 105 and the CG 107) as a Fowler-Nordheim tunnel current, thereby erasing written data.

The data reading operation will be described next. In a state where the potential of the N+ type source layer 102 is at 0 V, the potential of the N+ type drain layer 103 is at about 1 V, and the potential of about 3 V is applied to the CG 107, it is judged whether or not data exists depending on whether or not an N type channel layer of an inversion layer is formed in the front surface of the P type well layer 101 immediately under the gate insulation film 104. In a state where electrons are absorbed in the FG 105, the threshold voltage Vt becomes high, the N type channel layer is not formed, and thus an electric current does not flow between the N+ type source layer 102 and the N+ type drain layer 103.

A relevant split gate type nonvolatile semiconductor memory device is described in the Japanese patent application publications Nos. 2000-173278 and 2008-140431.

In the Japanese patent application publications Nos. 2000-173278 and 2008-140431, it is necessary to absorb hot electrons in the FG 105 as much as possible in order to secure the high writing performance. The amount of absorbed electrons increases as the potential of the FG 105 is higher. The potential of the FG 105 as a floating gate is given from the N+ type source layer 102 at high potential that is capacitively coupled with this FG 105.

In detail, the potential difference between the N+ type source layer 102 and the CG 107 is split by the electrostatic capacitance between the N+ type source layer 102 and the FG 105 and the electrostatic capacitance between the FG 105 and the CG 107. Therefore, the potential of the FG 105 is higher as the electrostatic capacitance between the N+ type source layer 102 and the FG 105 increases. In order to increase the electrostatic capacitance between the N+ type source layer 102 and the FG 105, it is necessary to increase the overlapping area of the N+ type source layer 102 and the FG 105 as much as possible. In other words, the coupling ratio between the N+ type source layer 102 and the FG 105 need be increased.

However, this results in a larger memory cell, causing a difficulty in miniaturizing a split gate type nonvolatile semiconductor memory device. It is necessary to minimize the size of the overlapping area between the N+ type source layer 102 and the FG 105 in the occupation area of the memory cell on the P type well layer 101.

SUMMARY OF THE INVENTION

The invention provides a nonvolatile semiconductor memory device and a method of manufacturing the device. The device includes a semiconductor layer of a first general conductive type, a first element isolation layer and a second element isolation layer that are formed adjacent to each other in the semiconductor layer so as to elongate in a first direction in plan view of the memory device, and a trench disposed between the first and second isolation layers and having a first sidewall and a second sidewall opposite from the first sidewall. Iin the plan view of the memory device, the first sidewall is parallel to a second direction that is perpendicular to the first direction, and the second sidewall slants from the second direction. The device also includes a source layer of a second general conductive type formed in the second sidewall of the trench and a bottom portion of the trench, a first insulation film disposed on the first and the second sidewalls of the trench and on the bottom portion of the trench, a floating gate disposed on the first insulation film in the trench, and a control gate disposed on the semiconductor layer so as to overlap the first and second element isolation layers partially in the plan view of the memory device. The control gate overlaps the floating gate partially.

DETAILED DESCRIPTION OF THE INVENTION

Figure 1:
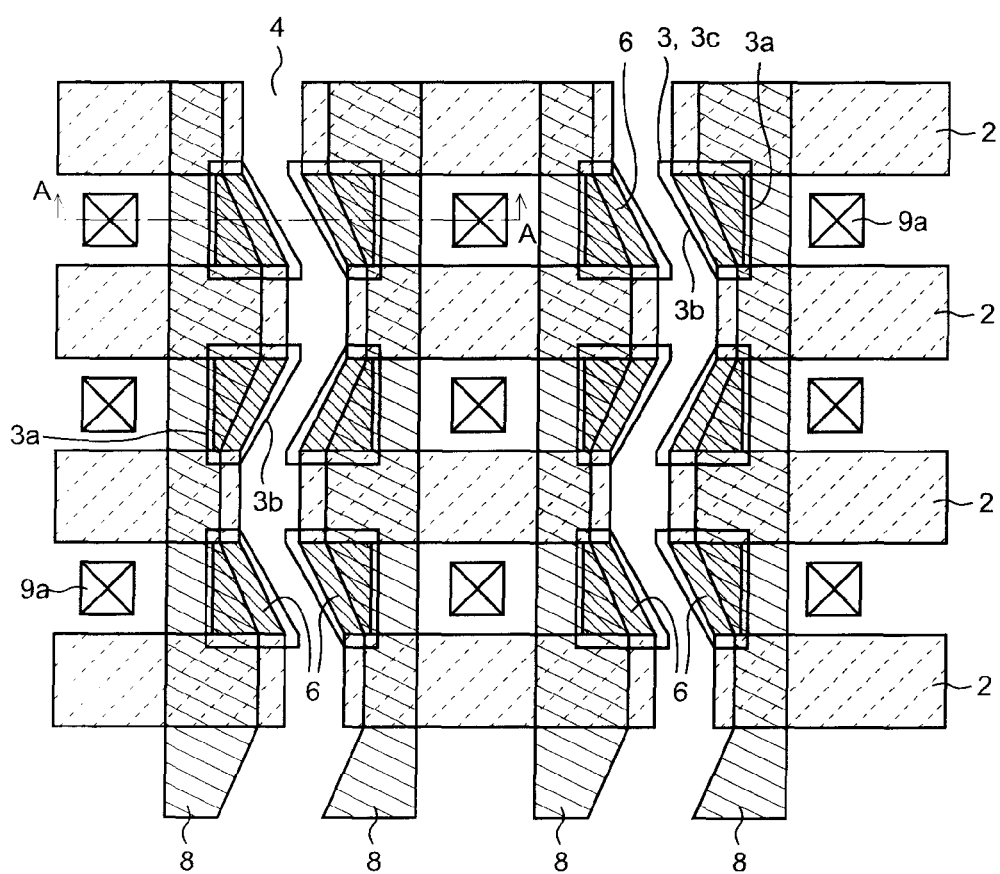
FIG. 1 is a plan view showing a split gate type nonvolatile semiconductor memory device and a method of the same in a first embodiment of the invention.
Figure 2A:
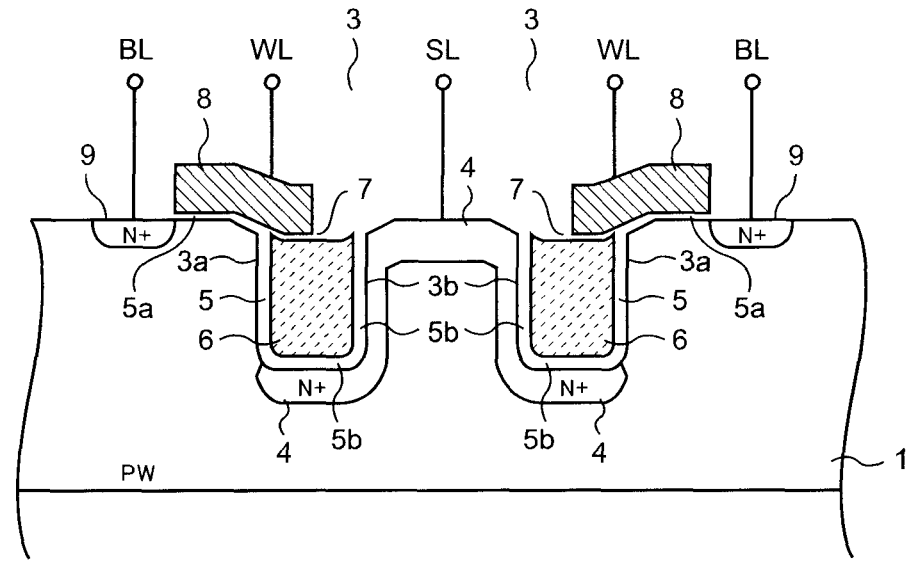
FIGS. 2A and 2B are cross-sectional views showing the split gate type nonvolatile semiconductor memory device and the method of manufacturing the same in the first embodiment of the invention.
Figure 2B:
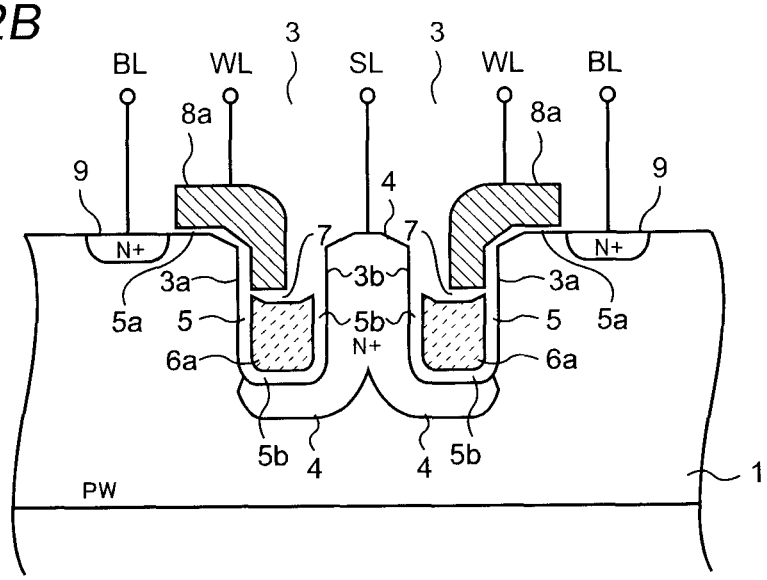

A first embodiment of the invention will be described referring to FIGS. 1 to 3B. FIG. 1 is a plan view of a split gate type nonvolatile semiconductor memory device of the embodiment. FIG. 2A is a cross-sectional view of FIG. 1 along line A-A. FIG. 2B is a cross-sectional view of a more miniaturized one of FIG. 1 along line A-A in the embodiment. A specific structural difference between FIG. 2A and FIG. 2B is that a channel layer under a CG 8 is formed in the front surface of a P type well layer 1 in FIG. 2A, while a channel layer under a CG 8a extends from the front surface of the P type well layer 1 to a first sidewall 3a of a trench 3 in FIG. 2B.

Figure 11A:
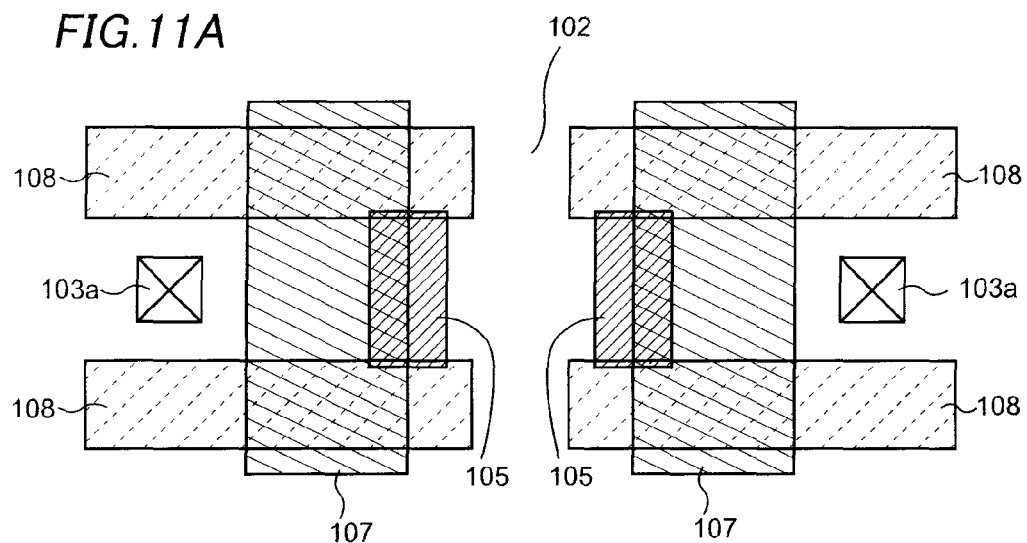
FIG. 11A is a plan view of a conventional split gate type nonvolatile semiconductor memory device.
Figure 11B:
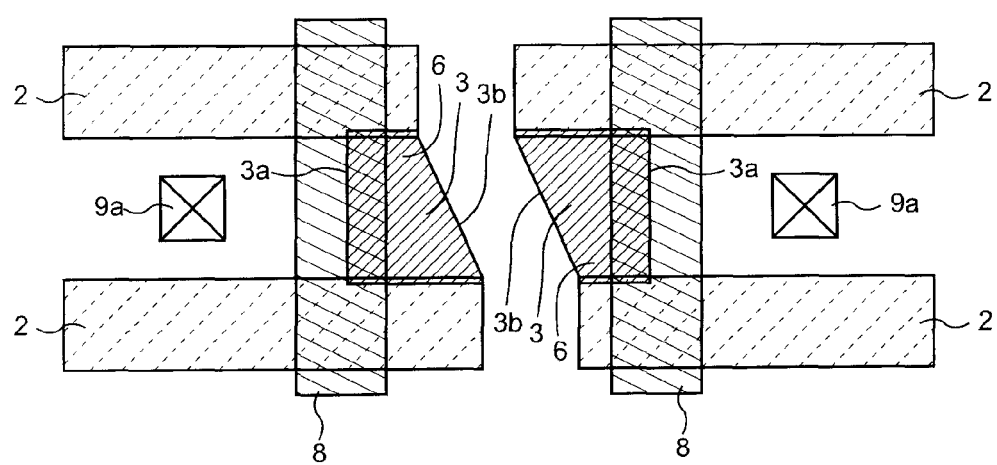
FIG. 11B is a plan view of the split gate type nonvolatile semiconductor memory device in the first embodiment of the invention.
Figure 12:
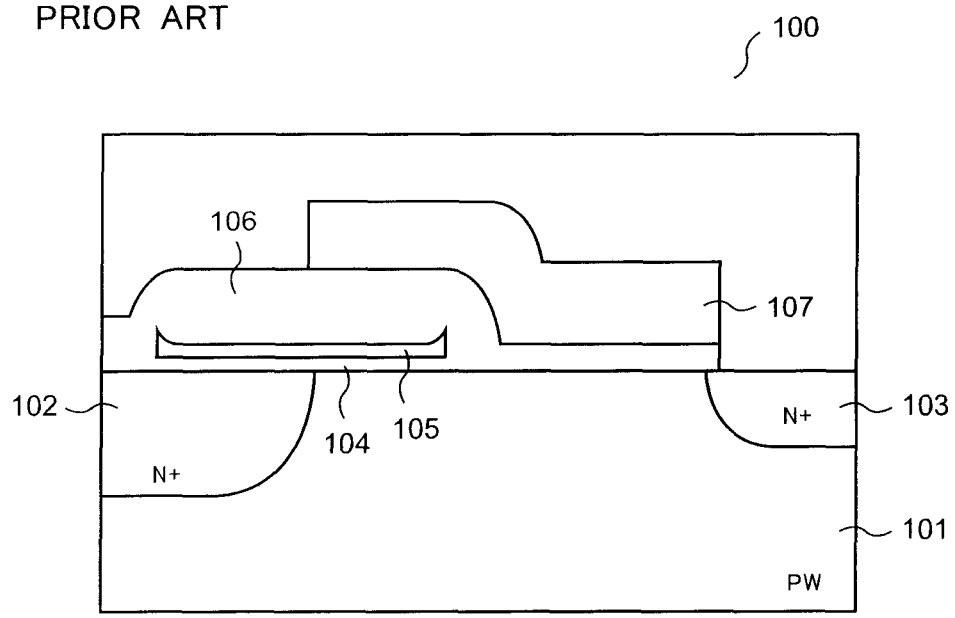
FIG. 12 is a cross-sectional view showing the memory cell structure of the conventional split gate type nonvolatile semiconductor memory device.

In FIG. 2B, a part of the CG 8a is foamed inside the trench 3 so as to reduce the lateral size compared with FIG. 2A. The reduced size state of the memory cell is shown in FIGS. 11A and 11B. FIG. 11A shows the configuration of a conventional memory cell, and FIG. 11B shows the configuration of the memory cell of FIG. 2A of the embodiment. The lateral size of the cell is reduced to about 80%. The cell of FIG. 2B is reduced to about 75% although not shown.

The structure of the memory cell of FIG. 1 will be described. A plurality of memory cells are formed, being isolated by a plurality of element isolation layers 2 (hereafter, referred to as STIs 2), and trapezoid trenches 3 are asymmetrically formed on the left and right sides of an N+ type source layer 4. The STIs 2 are preferably formed by shallow trench isolation. A floating gate 6 (hereafter, referred to as a FG 6) is formed in each of the trenches 3, and control gates 8 (hereafter, referred to as CGs 8) are formed from on the FGs 6 onto the STIs 2, overlapping a part of each of the FGs 6. An N+ type drain layer 9 is formed under each of drain contacts 9a that is disposed on one side of the CG 8 that is on the opposite side where the N+ type source layer 4 is formed, as shown in FIG. 2A.

It is noted that conductivity types such as N+, N and N− belong in one general conductivity type and conductivity types such as P+, P and P− belong in the other general conductivity type.

One distinctive feature of the embodiment is the shape of this trench 3 in the plan view. In general, when a trench is formed in a semiconductor substrate in a trench gate type DMOS power transistor or the like, the shape in the plan view is symmetrical like a rectangle, a circle, an oval or the like in most cases. On the other hand, in the embodiment, the trench 3 is formed between the adjacent STIs 2 as shown in FIG. 1. The trench 3 has two trench sidewalls that are almost aligned with the end surfaces of the two STIs 2 and parallel to the STIs 2, a trench sidewall 3a perpendicular to the STIs 2, and a trench sidewall 3b not perpendicular to the STIs 2 and not parallel to the trench sidewall 3a. The trench sidewall 3a and the trench sidewall 3b are opposite to each other. In other words, the shape of the trench 3 in the plan view is a trapezoid in the embodiment.

Figure 3A:
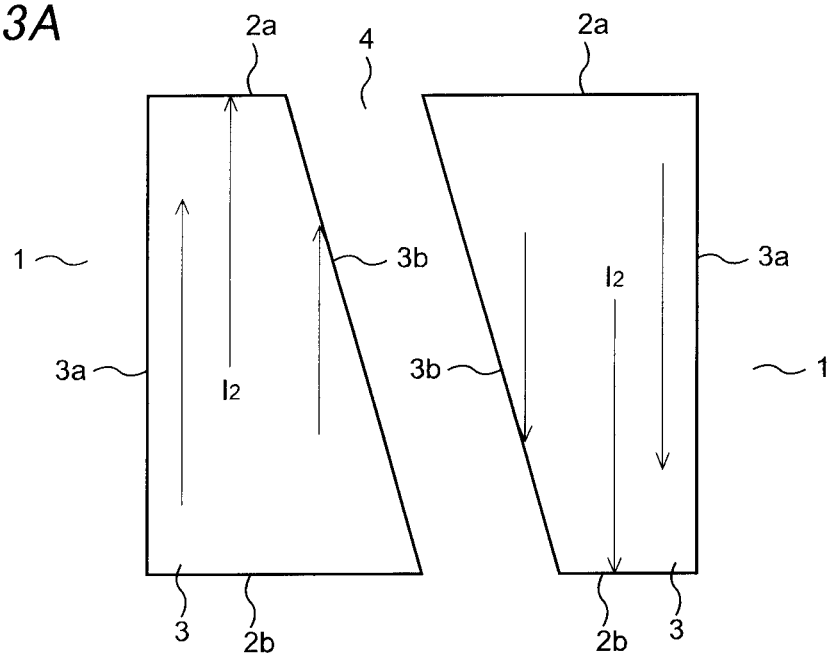
FIG. 3A is a plan view showing the method of manufacturing the split gate type nonvolatile semiconductor memory device in the first embodiment of the invention.

As shown in FIG. 2A, arsenic ion or the like is ion-implanted in the trench sidewalls 3b and the bottom surfaces of the trapezoid trenches 3 to form the N+ type source layer 4. In this case, as shown in FIG. 3A, the directions 12 of injection of ion to be implanted are set in a parallel direction to the trench sidewall 3a that is to be a channel layer and in a perpendicular or oblique direction to the P type well layer 1. By this, arsenic ion or the like is not implanted in the trench sidewall 3a and is implanted in the trench sidewall 3b and the bottom surface of the trench 3 only.

In general, in a trench gate type DMOS power transistor or the like, when an N+ type drain layer is embedded in the trench bottom surface, a complex process is performed in order to electrically lead the N+ type drain layer to the front surface of the semiconductor substrate, in which polysilicon or the like is embedded in the trench and led to the front surface of the semiconductor substrate. On the other hand, in the embodiment, as shown in FIG. 2A, the N+ type source layer 4 extending in the P type well layer 1 from the bottom surfaces of the trenches 3 onto the front surface of the P type well layer 1 through the trench sidewalls 3b is easily formed by ion-implanting arsenic ion or the like therein while changing the angle of impurity ion implantation. In the case of the more miniaturized cell as shown in FIG. 2B, the N+ type source layer 4 is formed in the P type well layer 1 from the bottom surfaces of the trenches 3 over a portion of the P type well layer 1 between the both trench sidewalls 3b.

As a result, the FG 6 or FG 6a formed in the trench 3 to a desired depth is completely overlapped by the N+ type source layer 4 formed on the trench sidewall 3b and the bottom surface of the trench 3. Furthermore, in the case of FIG. 2A, as described above, forming the FG 6 in the trench 3 reduces the memory cell area to about 80% of a conventional memory cell area. In the case of FIG. 2B, since a part of the CG 8a is formed in the trench so that the channel layer under the CG8a extends from in the front surface of the P type well layer 1 onto the sidewall 3a of the trench 3, the memory cell area is reduced to about 75% of a conventional memory cell area as described above.

As a result, in the embodiment, the memory cell area in the plan view is reduced to about 80% of a conventional cell, and the coupling ratio between the N+ type source layer 4 and the FG 6 is enhanced to about 80% except the trench sidewall portion along the STIs 2, thereby largely enhancing the writing performance of the nonvolatile semiconductor memory device in the embodiment.

The other features of the embodiment of the invention will be described. One of the features is the enhanced data retention performance. As described above, the N+ type source layer 4 opposed to the FG 6 with the gate insulation film 5b being interposed therebetween in FIG. 2A is formed by ion-implanting a high concentration of arsenic ion or the like in the trench sidewall 3b and the bottom surface of the trench 3. In this case, the P type well layer 1 on the trench sidewall 3b and the bottom surface of the trench 3 is damaged by the ion implantation.

When the gate insulation film 5 is formed on the whole surface of the P type well layer 1 including in the trench 3 next, a thick gate insulation film 5b is formed on the trench sidewall 3b and the bottom surface of the trench 3 that are damaged by the ion implantation by an accelerated oxidation phenomenon, compared with the gate insulation film 5 on the trench 3a that is not ion-implanted. This thick gate insulation film 5b prevents electrons accumulated in the FG 6 from leaking to the N+ type source layer 4, thereby enhancing the data retention performance.

It should be avoided to form the gate insulation film 5b too thick, since the too thick gate insulation film 5b reduces the electrostatic capacitance between the N+ type source layer 4 and the FG 6 to degrade the program characteristic. In this case, the gate insulation film 5b need be formed by combining thermal oxidation and a CVD method or the like, instead of only by thermal oxidation, so as to balance between the program performance and the data retention performance. Alternatively, a cap oxide film may be formed in the trench 3 and then the ion implantation may be performed. After the ion implantation, the cap oxide film may be removed and the gate insulation film 5 may be further formed.

In this case, depending on the thickness of the cap oxide film, the damage of the trench sidewall 3b and the bottom surface of the trench 3 due to the ion implantation is adjustable, and the difference in thickness between the gate insulation film 5 on the trench sidewall 3a and the gate insulation film 5b on the trench sidewall 3b and the bottom surface of the trench 3 is adjustable. This makes it possible to balance between the data retention performance and the program performance.

The other of the features of the invention will be described below. It is the reduced electric resistance of the channel layer to an electron current flowing through the channel layer in the memory cell. The reduction is achieved by utilizing the characteristic that the electron mobility differs depending on the orientation of the crystal plane where an electron current flows. When the charge amount of electrons is e, a relation of $\sigma = en\mu$ is established between the conductivity $\sigma$, the electron concentration n and the mobility $\mu$. Therefore, as the mobility $\mu$ increases, the conductivity $\sigma$ increases accordingly.

For example, when the P type well layer 1 is formed as a part of a silicon single crystal substrate and when the plane orientation of the orientation flat of the silicon wafer is (100) and the plane orientation of the P type well layer 1 is (100), the plane orientation of the trench sidewall 3a perpendicular to the orientation flat is (100) and the plane orientation of the trench sidewall 3a that is oblique by 45° to the orientation flat is (110). The electron mobility of the plane (100) tends to be higher than that of the plane (110).

Therefore, among the sidewalls of the trench 3, the trench sidewall 3a where the channel layer is to be formed is formed as a plane (100) perpendicular to the orientation flat, thereby reducing the resistance of the channel layer compared with a case of the trench sidewall 3a formed as other angled plane. This reduces the electric resistance of the whole memory cell to an electron current when the memory cell is turned on, thereby enhancing the power use efficiency and the like.

In this case, in the embodiment, the trench sidewall 3b on which the N+ type source layer 4 is to be formed is not parallel to the trench sidewall 3a. For example, when the trench sidewall 3b is formed so as to make an angle of 45° with the trench sidewall 3a, the crystal plane of the trench sidewall 3b is a plane (110). When the trench sidewall in this state is thermally oxidized, a thicker oxide film is formed on the trench sidewall 3b as a plane (110) than on the trench sidewall 3a as a plane (100). This reduces the amount of electrons leaking from the FG 6 to the N+ type source layer 4, thereby enhancing the data retention performance.

Furthermore, the trench sidewall 3a on which the channel layer is to be formed is formed so as to have a predetermined plane orientation, and the plane orientation of the trench sidewall 3b on which the N+ type source layer 4 is to be formed is determined taking into account of the oxidation rates of the trench sidewall 3b and the trench sidewall 3a including the accelerated oxidation which is caused by the damage by the ion implantation described above. As a result of this, the gate insulation film 5b formed on the trench sidewall 3b is thicker than the gate insulation film 5 formed on the trench sidewall 3a, thereby balancing between the program performance and the data retention performance.

In the case described above, since the plane orientation of the bottom surface of the trench 3 is (100) providing the oxide film on it with the same thickness as the thickness of that on the trench sidewall 3a, the enhancement of the data retention performance on the bottom surface of the trench 3 is to be addressed. However, the oxidation at the bottom surface of the trench 3 is accelerated due to the damage by the ion implantation as described above, the gate insulation film 5b on the bottom surface of the trench 3 becomes thick and the data retention performance is enhanced. Furthermore, for the purpose of enhancing the insulation breakdown voltage or the like, the upper end portion of the trench 3 and the corner portions of the trench bottom surface are formed so as to be curved by light etching. Since the bottom surface of the trench 3 becomes an arc surface instead of a flat surface by the light etching, the orientation of this is different from the plane orientation on the trench sidewall 3a, and this also contributes to the thicker oxide film on the bottom surface of the trench 3 than the oxide film on the trench sidewall 3a.

Although the shape of the trench 3 in the plan view is shown as a trapezoid in the embodiment, the shape is not limited to the trapezoid and other shape may be employed as long as the technical principle is unchanged. For example, the ion implantation may be performed in a constant direction by disposing the trapezoid trenches 3 on the left and right sides of the N+ type source layer 4 in the same direction, different from FIG. 1, or the shape of the trench sidewall 3b may be a triangle, an arc or the like.

Next, a method of manufacturing the split gate type nonvolatile semiconductor memory device of the first embodiment will be described referring to FIGS. 1 to 3B. First, a semiconductor substrate having the P type well layer 1 as shown in FIG. 2A is provided by a predetermined process. Then, as shown in FIG. 1, the STIs 2 dividing the P type well layer 1 in a plurality of memory cell formation regions are formed. The STIs 2 are formed by the following process. In detail, the P type well layer 1 is etched by anisotropic dry-etching or the like to form shallow trenches (not shown) in the P type well layer 1, and an oxide film (not shown) is formed so as to fill the trenches and form an almost flat front surface using a nitride film or the like (not shown) as a mask.

Then, as shown in FIG. 1, the trenches 3 that are trapezoid in the plan view are formed by predetermined anisotropic dry-etching or the like, in each of which two sides align with the end portions of the STIs 2, another side is perpendicular to the STIs 2, and the other side is oblique to the STIs 2. The trenches 3 are formed by etching the gate insulation film 5 and the P type well layer 1 using a trench forming mask 3c as an etching mask.

The cross-sectional shapes of the trenches 3 are shown in FIG. 2A. As shown in FIG. 2A and so on, arsenic ion or the like is then ion-implanted in the trench sidewalls 3b and the bottom surfaces of the trenches 3 to form the N+ type source layer 4.

Figure 3B:
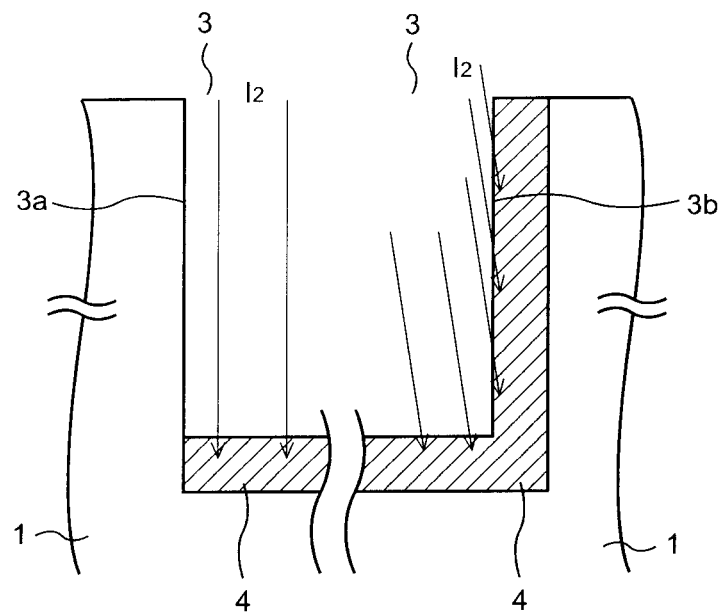
FIG. 3B is a cross-sectional view showing the method of manufacturing the split gate type nonvolatile semiconductor memory device in the first embodiment of the invention.

The direction of implanting arsenic ion or the like is a distinctive feature of the embodiment. This will be described referring to FIGS. 3A and 3B schematically showing the state. FIG. 3A shows a plan view of the trenches from the upper side of the trenches 3. Each of the trenches includes the trench sidewall 2a and the trench sidewall 2b that are aligned with the end surfaces of the STIs 2, the trench sidewall 3a that is perpendicular to the STIs 2, and the trench sidewall 3b that is not parallel to the trench sidewall 3a as described above, forming a trapezoid in the plan view.

The P type well layer 1 does not exist on the trench sidewall 2a and trench sidewall 2b that are aligned with the end surfaces of the STIs 2 and only the element isolation insulation films are exposed from the trench sidewall 2a and 2b, since the depths of the STI 2 trenches are deeper than those of the trenches 3 for the memory cell. Namely, the trench sidewall 2a and trench sidewall 2b are made of the STIs 2 itself. These trench sidewall 2a and trench sidewall 2b may be excluded from the consideration of the coupling ratio between the N+ type source layer 4 and the FG 6 that is an effect of the embodiment.

Arrows I2 indicating the directions of implanting arsenic ion or the like shown in FIG. 3A shows a projection of the injection state from the upper side of the trench 3, in which arsenic ion or the like is injected in a parallel direction to the trench sidewall 3a, in a perpendicular direction or at a given angle to the P type well layer 1 of the bottom surface of the trench 3, and at a given angle to the trench sidewall 3b. The given angle may be, for example, about 7° to the perpendicular line to the P type well layer 1, that is generally employed to avoid channeling of arsenic ion or the like. The figure shows that arsenic ion or the like is not injected in the trench sidewall 3a and is injected in the trench sidewall 3b and the bottom surface of the trench 3.

FIG. 3B shows a detailed state of the injection of arsenic ion or the like in each of the sidewalls. On the left side in FIG. 3B, the arrows I2 of injection of arsenic ion or the like are parallel to the trench sidewall 3a, and thus arsenic ion is not implanted in the trench side wall 3a. Arsenic ion or the like is injected only in the bottom portion of the trench 3 to Ruin the N+ type source layer 4 there.

On the other hand, on the right side in FIG. 3B, the arrows I2 of injection of arsenic ion or the like make an angle with the trench sidewall 3b and the bottom surface of the trench 3. As a result, arsenic ion or the like is implanted in the trench sidewall 3b and the bottom surface of the trench 3 to form the N+ type source layer 4 there. As described above, it is a distinctive feature of the embodiment that the arrows I2 as the direction of injecting arsenic ion or the like are parallel to the trench sidewall 3a, perpendicular or at a given angle to the P type well layer 1 of the bottom surface of the trench 3, and at a given angle to the trench sidewall 3b.

When the shapes of the trenches 3 in the plan view are trapezoids as shown in FIG. 1 that are disposed in the reversed directions on the opposite sides of the N+ type source layer 4, the implantation need be performed in the upward and downward symmetrical directions in FIG. 3A. Furthermore, in order to implant arsenic ion or the like in the corner portions sufficiently, the implantation need be performed in the perpendicular direction to the P well layer 1. Otherwise, the ion implantation in the corner portions is not sufficient due to a barrier of the trench sidewalls etc. From this aspect, the ion implantation process is facilitated by using an ion implantation equipment that can emit ion beams in the perpendicular direction to the P type well layer 1 and swing ion beams in a given angle range.

Then, as shown in FIG. 2A, the gate insulation film 5 is formed on the whole front surface of the P type well layer 1 including in the trenches 3 by thermal oxidation. At this time, the predetermined gate insulation film 5 is formed on the trench sidewall 3a, while the gate insulation film 5b that is thicker than the gate insulation film 5 on the trench sidewall 3a is formed on the trench sidewall 3b and the bottom surface of the trench 3 that are damaged by the ion implantation by accelerated oxidation. At this time, the gate insulation film 5 having the same thickness as the gate insulation film 5 on the trench sidewall 3a is formed on the P type well layer 1.

Then, as shown in FIG. 2A, a polysilicon film doped with predetermined impurities is deposited over the whole front surface of the P type well layer 1 including in the trenches 3, and the polysilicon is etched back by predetermined anisotropic dry-etching or the like to form the FGs 6 filling the trenches 3. The FGs 6 that are formed in this manner are largely overlapped by the N+ type source layer 4 formed on the bottom surface of the trench 3 and the trench sidewall 3b with the gate insulation film 5a being interposed therebetween, thereby realizing the high coupling ratio between the N+ type source layer 4 and the FG 6.

The tunnel insulation film 7 is then formed on the FGs 6 by a predetermined thermal oxidation or CVD method. At this time, the gate insulation film 5a is formed on the P type well layer 1, overlapping the gate insulation film 5 that is previously formed. A polysilicon film doped with predetermined impurities is then deposited on the whole surface of the P type well layer 1 including on the FGs 6, and the CGs 8 are formed by a predetermined photo-etching process so as to partially overlap the FGs 6 with the tunnel insulation film 7 being interposed therebetween and extend on the P type well layer 1 with the gate insulation film 5a being interposed therebetween.

Phosphorus ion or the like is then ion-implanted by self-alignment with the CGs 8 to form an LDD (lightly doped drain) layer, and arsenic ion or the like is then ion-implanted using a spacer formed by a CVD method to form the N+ type drain layers 9. Then an interlayer insulation film (not shown) is formed, contact holes are formed, electrodes are formed, and finally a passivation film is formed, thereby completing the split gate type nonvolatile semiconductor memory device. WL shown in FIGS. 2A and 2B indicates a word line made of the CG 8, and BL indicates a bit line connected to the N+ type drain layer 9.

Figure 4:
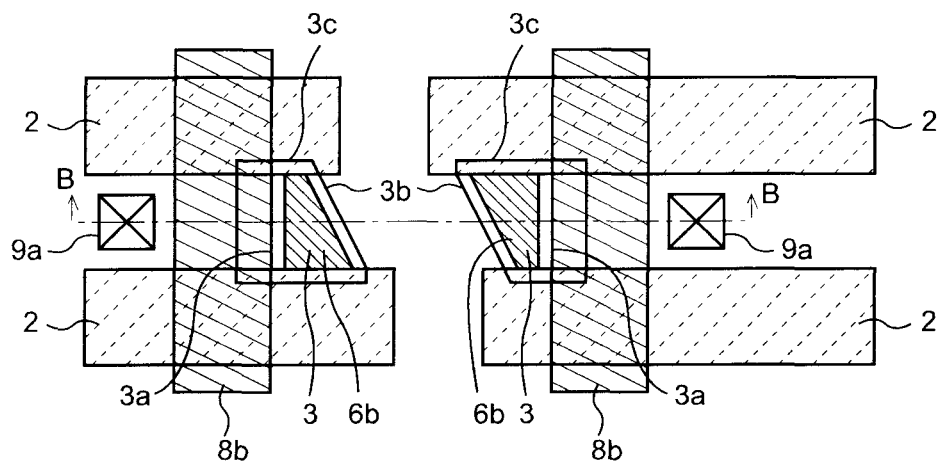
FIG. 4 is a plan view showing a split gate type nonvolatile semiconductor memory device and a method of manufacturing the same in a second embodiment of the invention.
Figure 5:
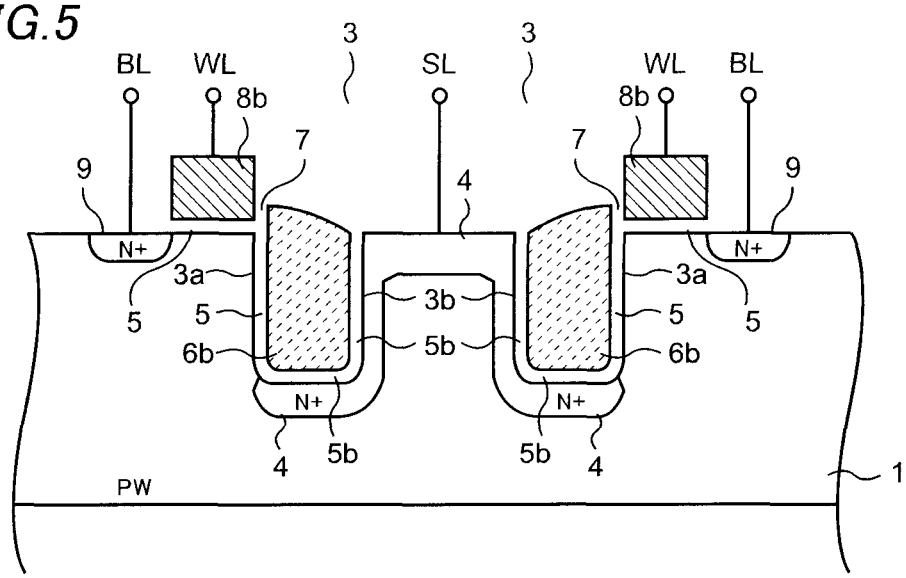
FIG. 5 is a cross-sectional view showing the split gate type nonvolatile semiconductor memory device and the method of manufacturing the same in the second embodiment of the invention.

Next, a second embodiment of the invention will be described referring to FIGS. 4 and 5. FIG. 4 is a plan view of a split gate type nonvolatile semiconductor memory device of the embodiment, and FIG. 5 is a cross-sectional view of the memory cell portion of FIG. 4 along line B-B. The second embodiment differs from the first embodiment in that more miniaturization is achieved by forming each of trenches 3 such that a trench sidewall 3a is flush with one of the side surfaces of a CG 8b in the vertical direction by self-alignment with it as shown in FIGS. 4 and 5. Furthermore, each of N+ type drain layers 9 is also formed by self-alignment with the CG 8b and so on. The other structure is the same as that of the first embodiment.

FIG. 4 shows a trench forming mask 3c. This trench forming mask 3c has a trapezoid opening in the plan view of FIG.

4. In detail, the trench forming mask 3c has two opening end portions on two STIs 2 that are formed parallel, and has a third opening end portion on the CG 8b that is perpendicular to the STIs 2. A fourth opening end portion obliquely crosses between the two STIs 2. The trench 3 is formed using the trench forming mask 3c so as to have the trench sidewall 3a that is flush with one of the side surfaces of the CG 8b by self-alignment.

This further reduces the occupation area of the memory cell, and achieves miniaturization to about 70% of a conventional memory cell area, and this is the feature of the embodiment. The second embodiment has the same effect as the first embodiment in that the gate insulation film 5b between the N+ type source layer 4 and the FG 6b on the trench sidewall 3b is thicker than the gate insulation film 5 on the trench sidewall 3a on the channel side to enhance the data retention performance, the coupling ratio between the N+ type source layer 4 and the FG 6b is high to enhance the memory performance, and so on.

Figure 6:
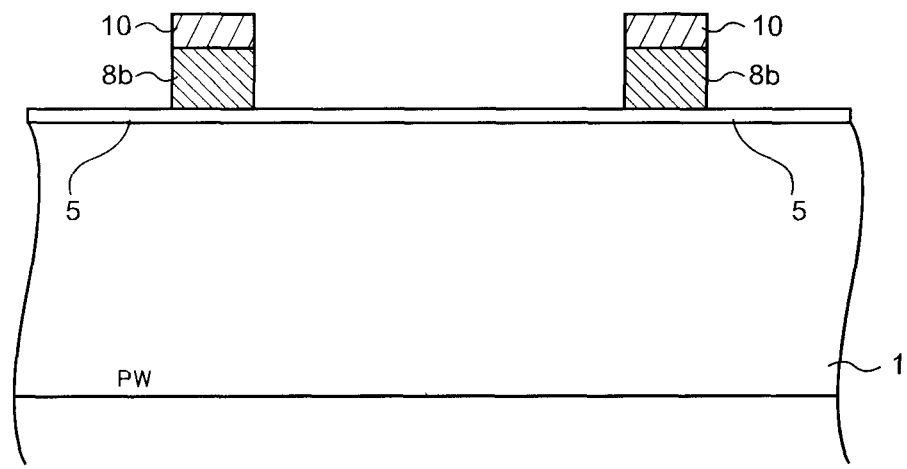
FIGS. 6 to 10 are cross-sectional views showing the method of manufacturing the split gate type nonvolatile semiconductor memory device in the second embodiment of the invention.

A method of manufacturing of the split gate type nonvolatile semiconductor memory device of the embodiment will be described referring to FIGS. 6 to 10. The same process as in the first embodiment is performed until the plurality of STIs 2 are completed to be formed in the P type well layer 1. Then, as shown in FIG. 6, the gate insulation film 5 is formed on the whole surface of the P type well layer 1, and a polysilicon layer is deposited thereon by a CVD method. A thick oxide film 10 is then deposited on the whole surface of the polysilicon layer, and then a predetermined photo-etching process is performed to form the CGs 8b on which the insulation films 10 are disposed.

Figure 7:
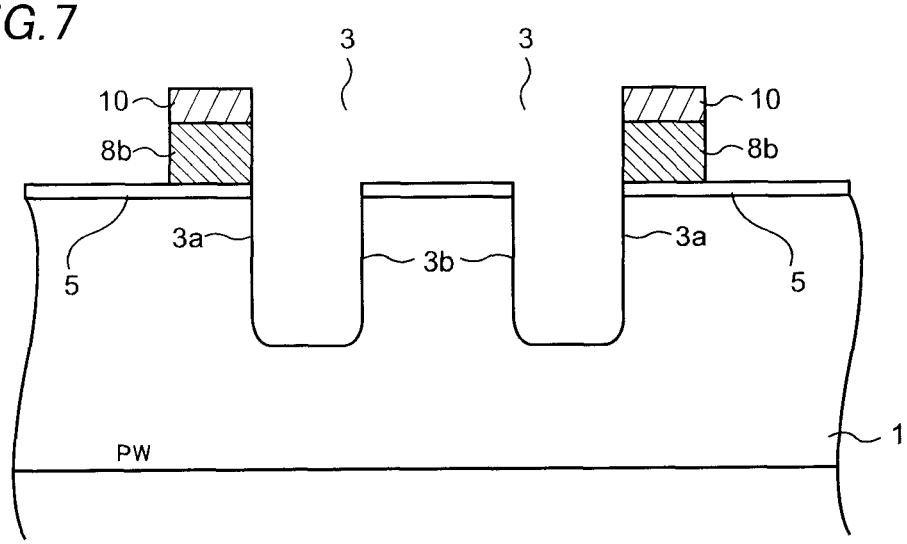

Then, the trench forming mask 3c is formed as described above referring to FIG. 4, and the gate insulation film 5 and the P type well layer 1 are etched by anisotropic dry-etching to form the trenches 3 in the P type well layer 1 as shown in FIG. 7. As described above referring to FIG. 4, the trench forming mask 3c partially overlaps the insulation films 10 on the CGs 8b and also partially overlaps the STIs 2, exposing the insulation films in these portions. However, since the thicknesses of these are much thicker than the gate insulation film 5, the insulation films 10 on the CGs 8b and the insulation film forming the STIs 2 are etched only partially, and thus the trench forming mask 3c functions enough as a mask for forming the trenches 3. At this time, each of the trench sidewalls 3a is formed flush with one of the side surfaces of the CG 8b by self-alignment with the CG 8b.

Figure 8:
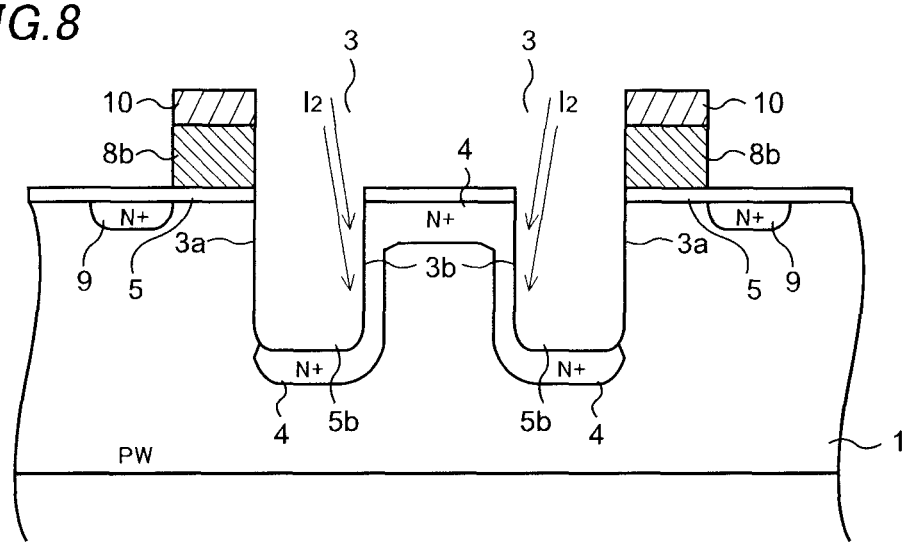

Then, as shown in FIG. 8, in the same manner as in the first embodiment, an N+ type source layer 4 is formed on the trench sidewalls 3b and the bottom surfaces of the trenches 3 by performing ion-implantation of arsenic ion or the like in a parallel direction to the trench sidewalls 3a, at a given angle to the trench sidewalls 3b, and in a perpendicular direction or at a given angle to the bottom surfaces of the trenches 3. The method of ion implantation is the same as in the first embodiment. At this time, arsenic ion or the like is also ion-implanted in the front surface of the P type well layer 1 between both the trenches 3 to form the N+ type source layer 4 there. Simultaneously, in the P type well layer 1 on the opposite sides of the CGs 8b to the sides where the trenches 3 are formed, an LDD layer (not shown) is formed and the N+ type drain layers 9 are formed by implanting arsenic ion or the like using a spacer (not shown) as a mask.

Figure 9:
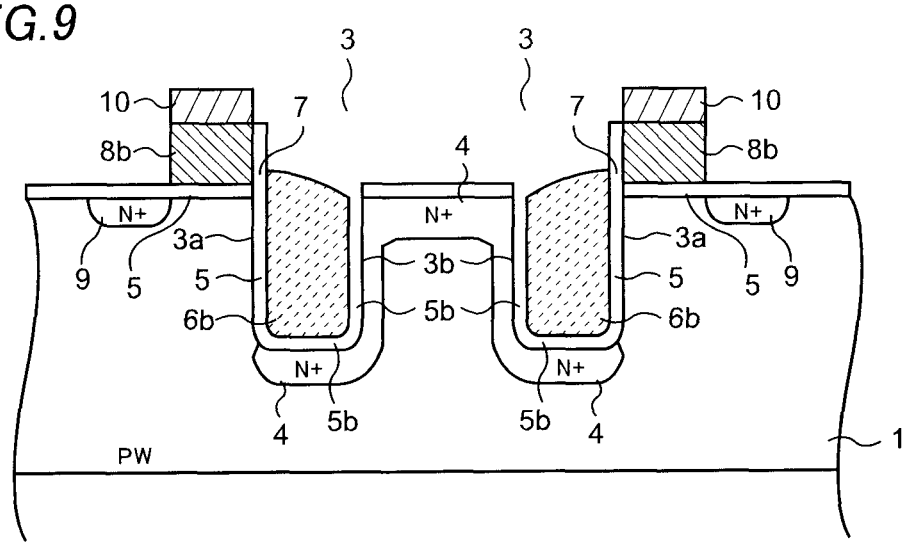
Figure 10:
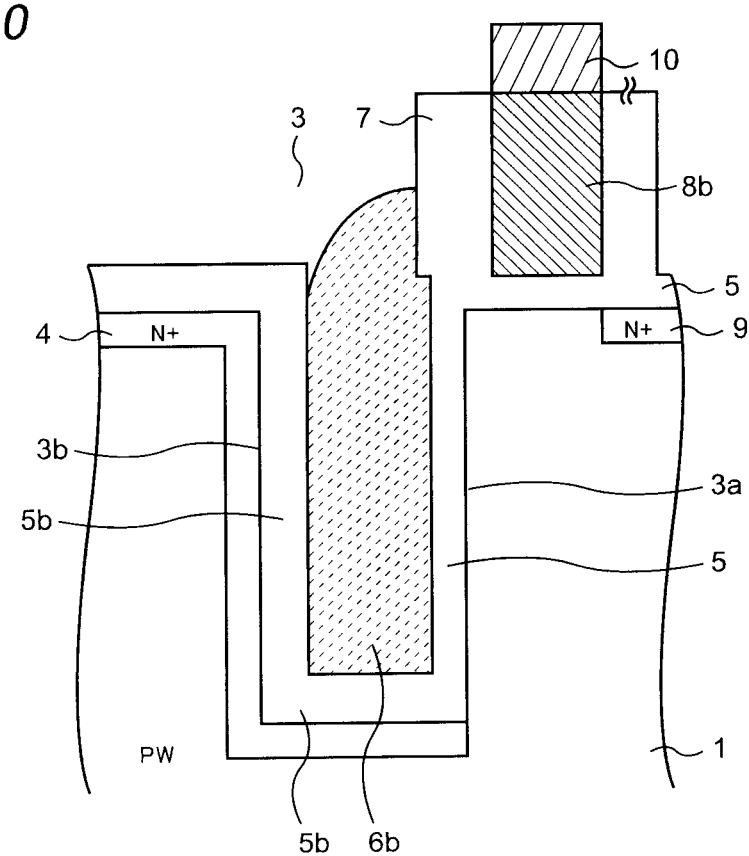

Then, as shown in FIGS. 9 and 10, the gate insulation films 5 are formed on the inner sidewalls of the trenches 3. In this case, too, in the same manner as in the first embodiment, the thicker gate insulation film 5b is formed on the trench sidewall 3b and the bottom surface of the trench 3 than the gate insulation film 5 on the trench sidewall 3a. Simultaneously, tunnel insulation films 7 are formed on the side surfaces of the CGs 8b that are flush with the trench sidewalls 3a. Since the CGs 8b are made of polysilicon doped with impurities, the tunnel insulation films 7 are thicker than the gate insulation film 5.

A polysilicon layer is then deposited on the whole surface of the P type well layer including in the trenches 3 by a CVD method, and the whole surface of the polysilicon layer is etched back by predetermined anisotropic dry-etching, thereby forming the FGs 6b that partially overlap the CGs 8b with the tunnel insulation films 7 being interposed therebetween and extend into the trenches 3 with the gate insulation films 5 and so on being interposed therebetween.

Then an interlayer insulation film is deposited, contact holes are formed, and metal wirings are formed, and finally a passivation film is formed, thereby completing the split gate type nonvolatile semiconductor memory device of the embodiment.

The nonvolatile semiconductor memory devices of the embodiments have a coupling ratio between the source layer and the floating gate that is high and the occupation area of the memory cell that is reduced over the conventional devices.

What is claimed is:

1. A nonvolatile semiconductor memory device comprising:
   a semiconductor layer of a first general conductive type;
   a first element isolation layer and a second element isolation layer that are formed adjacent to each other in the semiconductor layer so as to elongate in a first direction in plan view of the memory device;
   a trench disposed between the first and second isolation layers and comprising a first sidewall and a second sidewall opposite from the first sidewall, in the plan view of the memory device the first sidewall being parallel to a second direction that is perpendicular to the first direction and the second sidewall slanting from the second direction;
   a source layer of a second general conductive type formed in the second sidewall of the trench and a bottom portion of the trench;
   a first insulation film disposed on the first and the second sidewalls of the trench and on the bottom portion of the trench;
   a floating gate disposed on the first insulation film in the trench;
   a control gate disposed on the semiconductor layer so as to overlap the first and second element isolation layers partially in the plan view of the memory device, the control gate overlapping the floating gate partially; and
   a second insulation film disposed between the control gate and the floating gate.

2. The nonvolatile semiconductor memory device of claim 1, wherein the control gate overlaps the floating gate in the plan view of the memory device.

3. The nonvolatile semiconductor memory device of claim 1, wherein the control gate overlaps the floating gate in a sectional view of the memory device.

4. The nonvolatile semiconductor memory device of claim 1, wherein part of the floating gate is disposed in the trench.

5. The nonvolatile semiconductor memory device of claim 1, wherein an end surface of the control gate and the first sidewall of the trench are flush with each other.

6. The nonvolatile semiconductor memory device of claim 1, wherein the semiconductor layer comprises single crystal silicon and a plane orientation of the first sidewall is (100).

7. The nonvolatile semiconductor memory device of claim 1, wherein the first insulation film formed on the second sidewall and the bottom of the trench is thicker than the first insulation film formed on the first sidewall.

8. The nonvolatile semiconductor memory device of claim 1, wherein the trench comprises third and fourth sidewalls that are parallel to the first direction, and the first, second, third and fourth sidewalls form a trapezoid in the plan view of the trench.

9. A nonvolatile semiconductor memory device comprising:
- a semiconductor layer of a first general conductive type;
- a first element isolation layer and a second element isolation layer that are formed adjacent to each other in the semiconductor layer;
- a trench disposed between the first and second isolation layers, the trench comprising two sidewalls each extending from the first element isolation layer to the second element isolation layer in plan view of the memory device, and one of the two sidewalls slanting from the other of the two sidewalls in the plan view of the memory device;
- a source layer of a second general conductive type formed in the trench;
- an insulation film disposed in the trench to cover the source layer;
- a floating gate disposed on the insulation film in the trench; and
- a control gate disposed on the semiconductor layer so as to overlap the floating gate partially.

* * * * *